(12) United States Patent
Fujiyoshi et al.

(10) Patent No.: US 11,397,084 B2
(45) Date of Patent: Jul. 26, 2022

(54) VIBRATION GYROSCOPE

(71) Applicant: DENSO CORPORATION, Kariya (JP)

(72) Inventors: Motohiro Fujiyoshi, Nagakute (JP); Yoshiteru Omura, Nagakute (JP); Takashi Ozaki, Nagakute (JP); Tomoya Jomori, Kariya (JP); Katsuaki Goto, Kariya (JP); Megumi Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 183 days.

(21) Appl. No.: 16/795,950

(22) Filed: Feb. 20, 2020

(65) Prior Publication Data

US 2020/0191571 A1    Jun. 18, 2020

Related U.S. Application Data

(63) Continuation of application No. PCT/JP2018/029053, filed on Aug. 2, 2018.

(30) Foreign Application Priority Data

Aug. 24, 2017 (JP) .............................. JP2017-161594

(51) Int. Cl.
*G01C 19/5762* (2012.01)
*G01C 19/5705* (2012.01)
(Continued)

(52) U.S. Cl.
CPC ........ *G01C 19/5762* (2013.01); *B81B 3/0062* (2013.01); *G01C 19/5705* (2013.01);
(Continued)

(58) Field of Classification Search
CPC ........... G01C 19/5762; G01C 19/5705; G01C 19/5719; B81B 3/0062; H01L 29/84; H03H 9/24
See application file for complete search history.

(56) References Cited

U.S. PATENT DOCUMENTS 5,945,599 A * 8/1999 Fujiyoshi ........... G01C 19/5719
73/504.12
6,023,972 A * 2/2000 Hulsing, II ............. F02G 1/044
73/504.04
(Continued)

FOREIGN PATENT DOCUMENTS

JP           2000-055669 A       2/2000

OTHER PUBLICATIONS

English Translation of JP2000-055669.*
(Continued)

*Primary Examiner* — Helen C Kwok
(74) *Attorney, Agent, or Firm* — Posz Law Group, PLC (57) ABSTRACT

A vibration gyroscope includes: a mass part supported to be displaceable in a first direction and a second direction; an exciter vibrating the mass part in the first direction; and a detector detecting a displacement amount of the mass part in the second direction. The first direction and the second direction are orthogonal to each other. A resonance frequency of the mass part in the first direction coincides with a resonance frequency of the mass part in the second direction. A Q-factor of vibration of the mass part in the second direction is smaller than a Q-factor of vibration of the mass part in the first direction.

10 Claims, 8 Drawing Sheets

(51) Int. Cl.
*G01C 19/5719* (2012.01)
*B81B 3/00* (2006.01)
*H03H 9/24* (2006.01)
*H01L 29/84* (2006.01)

(52) U.S. Cl.
CPC .......... *G01C 19/5719* (2013.01); *H01L 29/84* (2013.01); *H03H 9/24* (2013.01); *B81B 2201/0242* (2013.01); *B81B 2203/0118* (2013.01)

(56) References Cited

U.S. PATENT DOCUMENTS

| | | | | |
|---|---|---|---|---|
| 6,023,973 | A | * | 2/2000 | Yabe ................ G01C 19/5663 310/316.01 |
| 6,032,972 | A | * | 3/2000 | Dias ........................ A61G 5/10 280/1.13 |
| 2003/0061878 | A1 | * | 4/2003 | Pinson ............... G01C 19/5719 73/514.33 |
| 2005/0066728 | A1 | * | 3/2005 | Chojnacki .......... G01C 19/5719 73/514.16 |
| 2010/0171397 | A1 | | 7/2010 | Yamada |
| 2012/0187803 | A1 | | 7/2012 | Yamada |
| 2013/0241364 | A1 | | 9/2013 | Yamada |
| 2013/0283911 | A1 | * | 10/2013 | Ayazi ..................... G01C 19/56 73/504.12 |
| 2016/0084654 | A1 | * | 3/2016 | Senkal ............... G01C 19/5726 73/502 |

OTHER PUBLICATIONS

Junichi Inoue, "Piezoelectric Vibrating Gyroscope and Application", Hybrids, vol. 8, No. 4, 1992, pp. 35-41 (and English Translation).

* cited by examiner

VIBRATION GYROSCOPE

CROSS REFERENCE TO RELATED APPLICATIONS

The present application is a continuation application of International Patent Application No. PCT/JP2018/029053 filed on Aug. 2, 2018, which designated the U.S. and claims the benefit of priority from Japanese Patent Application No. 2017-161594 filed on Aug. 24, 2017. The entire disclosures of all of the above applications are incorporated herein by reference.

TECHNICAL FIELD

The present disclosure relates to a vibration gyroscope.

BACKGROUND

A vibration gyroscope may include: a mass part supported as to be displaceable in each of first and second directions orthogonal to each other; an excitation actuator vibrating the mass part in the first direction; and a detector detecting the amount of displacement of the mass part in the second direction.

SUMMARY

The present disclosure describes a vibration gyroscope, which includes a mass part and a detector.

BRIEF DESCRIPTION OF DRAWINGS

The above and other objects, features and advantages of the present disclosure will become more apparent from the following detailed description made with reference to the accompanying drawings.

DETAILED DESCRIPTION

A vibration gyroscope may be a resonant type in which a resonance frequency of a mass part in a first direction and a resonance frequency of a mass part in a second direction coincide with each other, or a non-resonant type in which the respective resonance frequencies in the first and second directions are different. The resonant type may have a higher sensitivity; however, it may be difficult to adjust the resonance frequencies. In a situation where the respective resonance frequencies in two directions are slightly different, the sensitivity of measuring the number of rotation may greatly change. Thus, the measurement sensitivity may not be stable. Therefore, the non-resonant type has been widely adopted.

In one or more embodiments of the present disclosure, a vibration gyroscope, which is a resonant type, may have a smaller change in sensitivity with respect to the difference of respective resonance frequencies in both directions.

A vibration gyroscope according to an aspect of the present disclosure includes: mass part which is supported to be displaceable in each of a first direction and a second direction orthogonal to each other; an exciter vibrating the mass part in the first direction; and the detector detecting an amount of displacement of the mass part in the second direction. The resonance frequency of the mass part in the first direction and the resonance frequency of the mass part in the second direction coincide with each other, and a Q-factor of vibration in the second direction is smaller than a Q-factor of vibration in the first direction. Q-factor may also be called as a quality factor or Q-value.

Therefore, it is possible that suppress a temperature dependence of sensitivity by setting the Q-factor (namely, detection Q-factor) of vibration of the mass part in the detection direction to be smaller than the Q-factor (namely, excitation Q-factor) of vibration of the mass part in the excitation direction.

A Q-factor of a vibration in a first direction may be referred to as an excitation Q-factor. A Q-factor of a vibration in a second direction may be referred to as a detection Q-factor. The Q-factor (sharpness) is a dimensionless number, and the Q-factor is obtained by dividing a resonance frequency by a half-value width. The half-value width is a difference between a lower frequency, at which an amplitude is ($1/\sqrt{2}$ or 0.707 times) of the amplitude at a side lower than the resonance frequency, and a higher frequency, at which the amplitude is ($1/\sqrt{2}$ or 0.707 times) of the amplitude at a side higher than the resonance frequency. When the Q-factor is larger, a curve of the graph is steeper near the resonance frequency in an amplitude/frequency response diagram. When the Q-factor is smaller, a curve of the graph is relatively dull near the resonance frequency in an amplitude/frequency response diagram.

The first direction may be referred to as an excitation direction. The second direction may be referred to as a detection direction. An excitation actuator excites a mass part in the excitation direction. When a vibration gyroscope rotates around an axis orthogonal to both of the excitation direction and the detection direction, Coriolis force acts on the mass part in the detection direction. The mass part vibrates in the excitation direction. The Coriolis force depends on a rotational angular velocity of the mass part and a velocity of the mass part in the excitation direction. The amount of displacement of the mass part in the detection direction depends on the rotational angular velocity of the mass part and a velocity of the mass part in the excitation direction. The vibration gyroscope specifies the rotational angular velocity based on the amount of displacement of the mass part in the detection direction. The mass part vibrates at the resonance frequency of the vibration in the excitation direction (referred to as an excitation resonance frequency). Since the Coriolis force is synchronized with a vibrating frequency in the excitation direction, the mass part vibrates at the excitation resonance frequency also in the detection direction, in a situation that the Coriolis force acts in the detection direction. If the resonance frequency of the vibration in the detection direction (referred to as a detection resonance frequency) coincides with the excitation resonance frequency, the mass part vibrates with a maximum amplitude also in the detection direction. In this situation, a measurement sensitivity of the vibration gyroscope is maximized. However, in a situation where the detection resonance is slightly different from the excitation resonance frequency, the amplitude in the detection direction may greatly decrease. For example, since the structure partially expands or contracts depending on a temperature, the resonance frequency of the vibration gyroscope slightly changes depending on the temperature. The difference between the excitation resonance frequency and the detection resonance frequency varied with the temperature may be in a situation in which the measurement sensitivity of the vibration gyroscope changes with the temperature. In a situation where the curve of the graph near the detection resonance frequency in the amplitude/frequency response is steeper (in other words, the Q-factor is larger), a temperature dependence of the measurement sensitivity is higher.

The following describes an example of a structure of the vibration gyroscope. The vibration gyroscope includes a mass part, an exciter, a detector, a first beam, an excitation base part, and a second beam. The first beam extends along the detection direction (such as the second direction). The first beam has a first end part fixed at a fixing part, and a second end part, which is displaceable in the excitation direction (such as the first direction). The excitation base part is connected to the second end part of the first beam. The second beam extends along the excitation direction (such as the first direction). The second beam has a first end part connected to the excitation base part, and a second end part connected to the mass part. The second end part of the second beam is displaceable in the detection direction (such as the second direction). In other words, the mass part is supported by the fixing part through the first beam, the excitation base part, and the second beam. The exciter vibrates the excitation base part in the excitation direction (such as the first direction). When the exciter is activated, the second end of the first beam displaces periodically, and the mass part and the excitation base part vibrate in the excitation direction (such as the first direction). When the Coriolis force acts on the mass part, the second end part of the second beam periodically displaces in the second direction. In other words, the mass part vibrates on the vibration base part in the detection direction (such as the second direction).

The following method may lower the detection Q-factor for the above structure. The second beam is made of silicon. A substance having a smaller specific heat capacity than the silicon is embedded in a central portion of the end part of the second beam in the detection direction (such as the second direction). The vibration gyroscope may be applied for a Micro-Electro Mechanical System (MEMS) such as making a silicon substrate through, for example, etching. In this situation, the first beam and the second beam are made of silicon. When the specific heat capacity is smaller, the Q-factor tends to be smaller. In other words, the specific heat capacity and the Q-factor positively correlate. Therefore, the Q-factor may be lowered by embedding a substance having smaller specific heat capacity at the central portion of the end part of the second beam. The following describes a reason of embedding a substance having smaller specific heat capacity in the central portion of the end part in the detection direction (such as the second direction). Since the second beam vibrates in the detection direction (such as the second direction), tensile stress is applied to one side of the second beam in the detection direction, and compressive stress is applied to the other side of the second beam in the detection direction. The temperature decreases at the side where the tensile stress is applied, and the temperature increases at the side where the compressive stress is applied. As the substance having smaller specific heat capacity is embedded in the central portion of the end part in the detection direction (second direction), a heat movement between both sides of the second beam in the detection direction (such as the second direction) is slower and the Q-factor decreases.

The Q-factor may be adjusted by thermal conductivity of the first beam or the second beam.

In a structure in which a substance with a larger linear expansion coefficient (such as a thermal expansion coefficient) than the silicon is embedded in a position away from a neutral surface of the vibration of the second beam made of silicon in the detection direction (such as the second direction), the detection Q-factor may be lowered. The Q-factor has a negative correlation with the linear expansion coefficient. In other words, the detection Q-factor may be lowered, as the linear expansion coefficient of the second beam is enlarged. The detection Q-factor may be lowered, as a substance with a larger linear expansion coefficient is embedded in the second beam. It is noted that the effect is smaller even if the substance with a larger linear expansion coefficient is embedded along the neutral surface. The neutral surface is a virtual surface where neither the tensile stress nor compressive stress occurs during vibration. Since the Q-factor depends on a change in an internal stress of the beam, even if the substance having a large linear expansion coefficient is embedded in a portion where a stress is not generated, the influence on the Q-factor is smaller.

In a structure in which a substance having a larger internal friction than the silicon is embedded into the second beam made of silicon, the detection Q-factor may be lowered. Since energy is dissipated due to internal friction, the detection Q-factor decreases (the Q-factor is also a value obtained by dividing an energy stored in the system by the dissipated energy). Magnesium or polyimide resin may be an example of substances having a larger internal friction than silicon. The substance having a larger internal friction may be embedded to overlap the neutral surface at the vibration in the second direction. As the substance is embedded in the neutral surface, the detection Q-factor may be lowered without having influence on rigidity of the second beam. Even if the substance is embedded along the neutral surface, since the substance has a thickness so that a shear force acts on the substance having a larger internal friction and results in energy dissipation. The similar effect may be achieved by covering the end part of the second beam made of silicon with the substance having a larger internal friction during deformation.

The vibration Q-factor (the excitation Q-factor) of the first beam may also be enlarged instead of lowering the vibration Q-factor (the detection Q-factor) of the second beam. For example, the excitation Q-factor may be enlarged by embedding a substance having a larger specific heat capacity into the first beam. Alternatively, the excitation Q-factor may be enlarged by making the first beam with silicon and embedding a substance with a smaller linear expansion coefficient than silicon in a position deviated from the neutral surface at the vibration in the first direction. The excitation Q-factor may be enlarged by making the first beam with silicon and embedding a substance, which has a smaller internal friction during deformation than silicon, inside the first beam.

The first beam includes a main beam and plural auxiliary beams. The auxiliary beam is slimmer than the main beam, and is connected to the main beam and the fixing part, or is connected to the main beam and the excitation base part. The plural auxiliary beams may also be respectively connected between the main beam and the fixing part, and between the main beam and the excitation base part. The auxiliary beam having a smaller width has faster thermal conduction, and therefore the Q-factor may be enlarged. It may be possible to suppress lowering of the rigidity of beam while enlarging the Q-factor by connecting the plural auxiliary beams between the main beam and the fixing part, or between the main beam and the excitation base part.

A mass part of a vibration gyroscope according to the present disclosure may be stored in a vacuum case. As the mass part is stored in the vacuum case, the influence of air viscosity and temperature may be removed. Thus, the measurement accuracy increases. On the other hand, since the measurement accuracy increases by removing the influence of air viscosity and temperature, the influence of a change in the measurement sensitivity due to the difference of the resonance frequencies becomes relatively significant. As the detection Q-factor is adjusted by the methods described above, a larger effect may be achieved. Even if the mass part is disposed in an atmosphere, a corresponding effect may also be obtained by adjusting the detection Q-factor with the methods described above.

The following further describes the present embodiment with reference to the drawings.

Figure 1A:
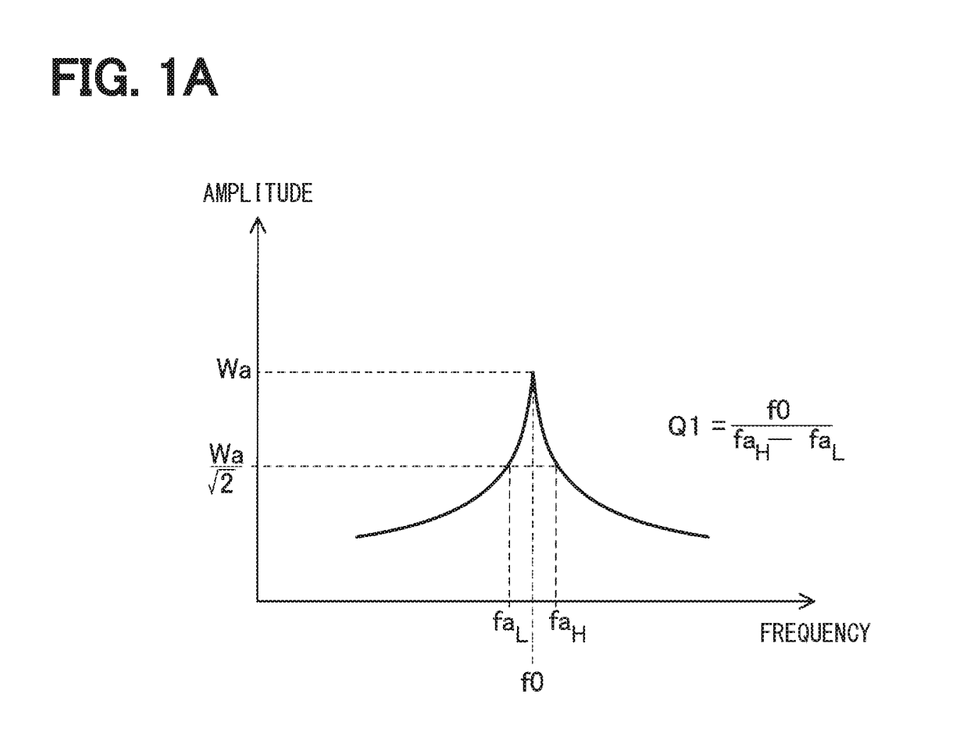
FIG. 1A is a graph for describing a Q-factor, and shows an example of a frequency response of vibration in an excitation direction (such as a first direction) of a mass part.
Figure 1B:
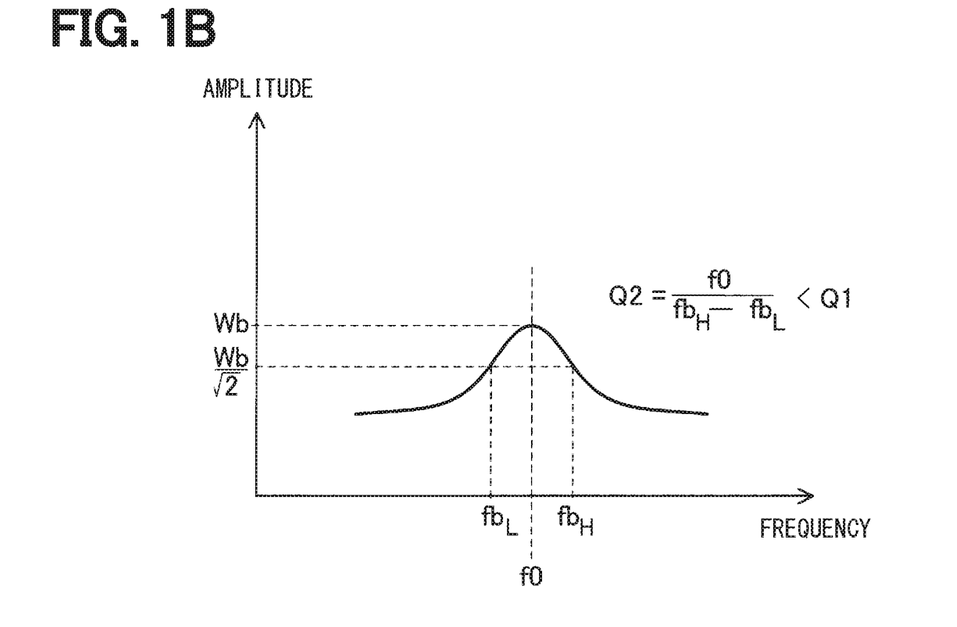
FIG. 1B is a graph for describing a Q-factor, and shows an example of frequency response of vibration in a detection direction (such as a second direction).

The following describes the Q-factor (sharpness) of vibration with reference to FIGS. 1A, 1B. FIGS. 1A, 1B each illustrate a graph in which a horizontal axis represents vibration frequency and a vertical axis represents amplitude. FIG. 1A illustrates a peak of the amplitude is sharper at a resonance frequency 'f0'. FIG. 1B illustrates a peak of the amplitude is relatively dull at the resonance frequency 'f0'. The Q-factor of vibration may be expressed by a mathematical expression of "$Q=f0/(f_H-f_L)$". Herein, 'f0' is the resonance frequency; '$f_H$' is a frequency at a side higher than the resonance frequency, where the amplitude is $(1/\sqrt{2})$ times of the amplitude at the resonance frequency; and '$f_L$' is a frequency at a side lower than the resonance frequency, where the amplitude is $(1/\sqrt{2})$ times of the amplitude at the resonance frequency. The difference between '$f_H$' and '$f_L$', that is, $(f_H-f_L)$ may be referred to as a half-width value.

When the Q-factor is larger, the curve of the frequency/amplitude graph is steeper around the resonance frequency. When the Q-factor is smaller, the curve of the graph is relatively dull around the resonance frequency. The Q-factor may also be a value, which is obtained by dividing energy stored in a system by dissipated energy. When the curve of the amplitude/frequency graph is relatively dull as the Q-factor is smaller, it may be understood that the dissipated energy is larger than the stored energy.

In a vibration gyroscope according to the present disclosure, a mass part vibrates in two directions (for example, excitation and detection directions), which are orthogonal to each other. The mass part is excited in the excitation direction by the exciter. When the vibration gyroscope rotates at an angular velocity having a third direction as a rotation axis, the Coriolis force causes the mass part to vibrate also in the detection direction. The third direction is orthogonal to both of the excitation and detection directions. The amount of displacement of the mass part in the detection direction caused by the Coriolis force depends on the angular velocity of the mass part and the velocity of the mass part in the excitation direction. The velocity in the excitation direction may be calculated by a force applied by the exciter. The angular velocity may be measured based on the displacement (such as the amplitude) of the mass part in the detection direction. In the vibration gyroscope according to the present disclosure, the resonance frequency in the excitation direction (referred to as "excitation resonance frequency) and the resonance frequency in the detection direction (referred to as "detection resonance frequency") are set to be coincided with each other. In the vibration gyroscope according to the present disclosure, the Q-factor of the vibration of the mass part in the detection direction (referred to as "detection Q-factor") is set to be smaller than the Q-factor of the vibration of the mass part in the excitation direction (referred to as "excitation Q-factor"). Therefore, it may be possible to suppress a change in the measurement accuracy of the vibration gyroscope (in other words, a change of the amount of displacement in the detection direction with respect to the vibration in the excitation direction), in a situation that the excitation resonance frequency and the detection resonance frequency do not coincide with each other.

For example, FIG. 1A represents vibration characteristics in the excitation direction. FIG. 1B represents vibration characteristics in the detection direction. The frequency 'f0' represents the excitation resonance frequency, and also represents the detection resonance frequency. A symbol 'Wa' indicates an amplitude at the resonance frequency 'f0' of the vibration in the excitation direction. A symbol 'Wb' indicates an amplitude at the resonance frequency 'f0' of the vibration in the detection direction. A symbol '$fa_L$' represents a frequency of the vibration in the detection direction at a side lower than the resonance frequency, where the amplitude is Wa/$\sqrt{2}$. A symbol '$fa_H$' represents a frequency of the vibration in the detection direction at a side higher than the resonance frequency, where the amplitude is Wa/$\sqrt{2}$. A symbol '$fb_L$' represents a frequency of the vibration in the detection direction at a side lower than the resonance frequency 'f0', where the amplitude is Wb/$\sqrt{2}$. A symbol '$fb_H$' represents a frequency of the vibration in the detection direction at a side higher than the resonance frequency 'f0', where the amplitude is Wb/$\sqrt{2}$. The excitation Q-factor is greater than the detection Q-factor as seen in FIG. 1.

Figure 2A:
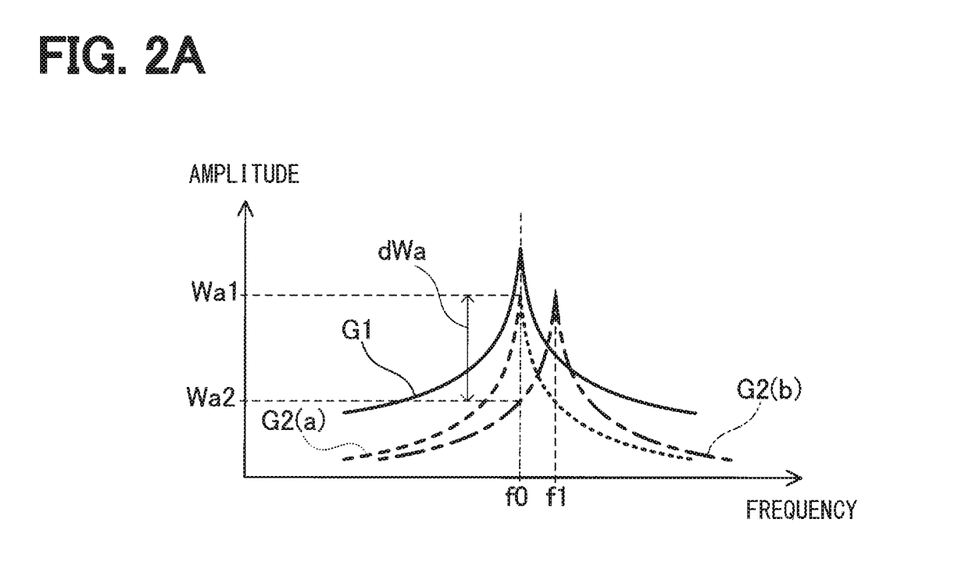
FIG. 2A is a graph that illustrates a change in measurement sensitivity (such as an amplitude in the detection direction) with respect to a difference of resonance frequencies, in a situation that an excitation Q-factor and a detection Q-factor coincide with each other.

The following describes a reason of lowering a change in measurement accuracy with respect to the difference between both of the resonance frequencies, in a situation where the above relations are satisfied. FIG. 2A illustrates that the Q-factor of the vibration in the excitation direction (in other words, excitation Q-factor) substantially coincides with the Q-factor of the vibration in the detection direction (in other words, detection Q-factor). The graph G1 illustrates the vibration characteristics in the excitation direction. The graph G2 illustrates the vibration characteristics of the vibration in the detection direction. In a situation where the resonance frequency of the graph G1 and the resonance frequency of the graph G2 match as illustrated by the graph G2(a), the mass part vibrates with the amplitude 'Wa1' in the detection direction caused by the Coriolis force based on the angular velocity. In a situation where the resonance frequency of the vibration in the detection direction is shifted from 'f0' to 'f1' as illustrated by the graph G2(b), the mass part vibrates with the amplitude 'Wa2' in the detection direction caused by the Coriolis force. An expression of "dWa=Wa1−Wa2" represents a change in the measurement sensitivity (for example, the displacement in the detection direction caused by the Coriolis force), in a situation where the resonance frequency in the detection direction is shifted to 'f1'. When the Q-factor of the vibration in the detection direction is larger, the vibration characteristics (for example, a change in the amplitude) is steeper. The amplitude in the detection direction greatly changes, even though the detection resonance frequency slightly deviates from the excitation resonance frequency. In other words, the measurement sensitivity greatly changes.

Figure 2B:
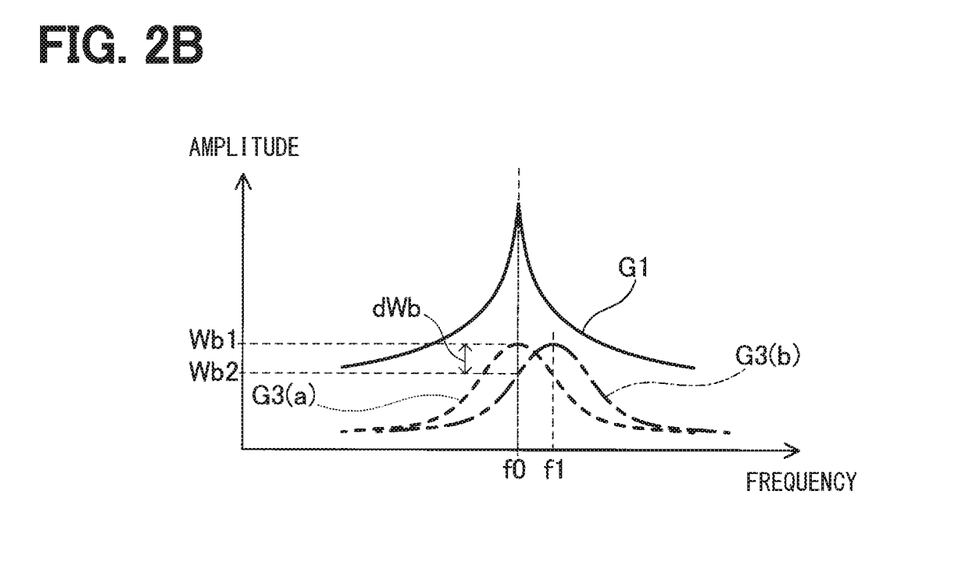
FIG. 2B is a graph that illustrates a change in measurement sensitivity (such as the amplitude in the detection direction) with respect to the difference of the resonant frequencies, in a situation that the detection Q-factor is smaller than the excitation Q-factor.

FIG. 2B illustrates that the Q-factor of the vibration in the detection direction (in other words, detection Q-factor) is smaller than the Q-factor of the vibration in the excitation direction (in other words, excitation Q-factor). The graph G1 illustrates the vibration characteristics in the excitation direction. The graph G3 illustrates vibration characteristics of the vibration in the detection direction. In a situation where the resonance frequency of the graph G1 and the resonance frequency of the graph G3 are matched as illustrated by the graph G3(a), the mass part vibrates with the amplitude 'Wb1' in the detection direction caused by the Coriolis force based on the angular velocity. In a situation where the resonance frequency of the vibration in the detection direction is shifted from 'f0' to 'f1' as illustrated by the graph G3(b), the mass part vibrates with the amplitude 'Wb2' in the detection direction caused by the Coriolis force. Therefore, the amplitude difference 'dWb', which is obtained by an expression of "Wb1−Wb2", is greatly smaller than the amplitude difference 'dWa' in FIG. 2A. When the Q-factor of the vibration in the detection direction is smaller, the vibration characteristics (for example, a change in the amplitude) is relatively dull. Therefore, it is possible to suppress a change in the amplitude, even though the detection resonance frequency slightly deviates from the excitation resonance frequency.

Figure 3:
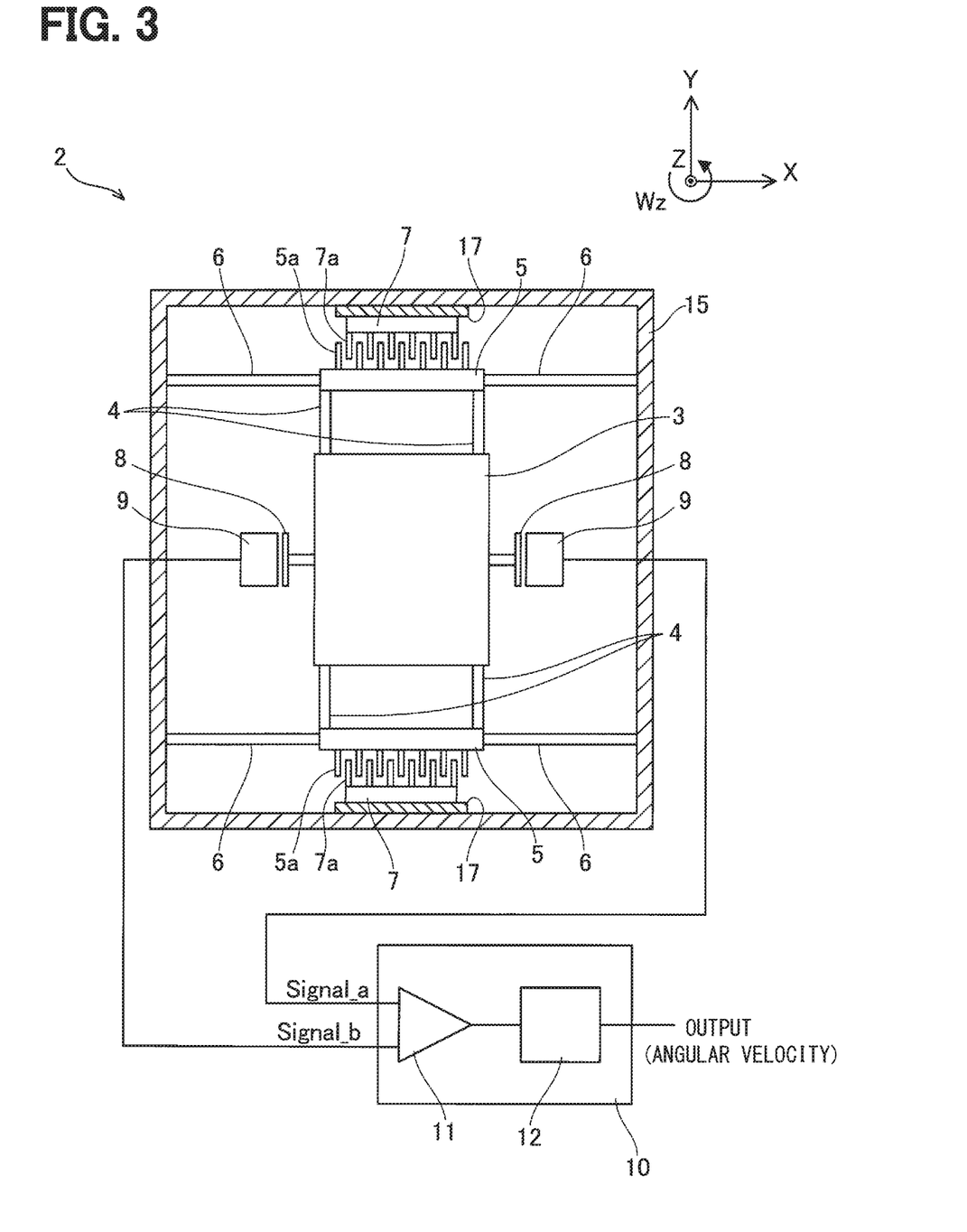
FIG. 3 is a schematic structural diagram of a vibration gyroscope according to an embodiment.

The following describes a vibration gyroscope according to an embodiment with reference to the drawings. FIG. 3 illustrates a plan view of a vibration gyroscope 2. The vibration gyroscope 2 may be referred to as a gyroscope 2. Main parts of the gyroscope 2 are stored inside a case 15. FIG. 3 illustrates an internal structure of the case 15. The gyroscope 2 is a small-sized gyroscope built on a silicon substrate by using MEMS technology. The case 15 is also made of silicon. The case 15 is a sealed type. An inner part of the case 15 is held in a vacuum state. FIG. 3 also illustrates a controller 10 in addition to the main parts of the gyroscope 2 stored in the case 15. The gyroscope 2 may measure an angular velocity Wz around a Z-axis in a coordinate system in the drawing.

The following describes the main parts of the gyroscope 2. The gyroscope 2 includes a mass part 3, two excitation base parts 5, four first beams 6, four second beams 4, two exciters 7 and a capacitance detector 9. The first beam 6 may be referred to as an excitation beam 6, and the second beam 4 may be referred to as a detection beam 4.

Each of four excitation beams 6 has a first end, which is fixed to the case 15 and extends in an X-direction in the coordinate system in the drawing. The excitation beam 6 is a cantilever beam, which has a first end fixed and a second end displaceable in a Y-direction in the coordinate system in FIG. 3. The excitation base part 5 is connected to the second end of the excitation beam 6. The upper two excitation beams 6 in the drawing support the upper excitation base part 5 from both sides of the upper excitation base part 5. The lower two excitation beams 6 in the drawing supports the lower excitation base part 5 from both sides of the lower excitation base part 5. The excitation base part 5 supported by the cantilever excitation beam 6 is displaceable in the Y-direction.

Each of the four detection beams 4 includes a first end, which is connected to the excitation base part 5 and extends in the Y-direction. The detection beam 4 includes a second end, which is displaceable in the X-direction. The second end of the detection beam 4 is connected to the mass part 3. The upper two detection beams 4 in the drawing extend downward in the drawing from the upper excitation base part 5. The lower two detection beams 4 in the drawing extend upward in the drawing from the lower excitation base part 5. The mass part 3 is supported by the upper two detection beams 4 and the lower two detection beams 4 in FIG. 3. The mass part 3 is supported by the case 15 through the excitation beams 6, the excitation base parts 5 and the detection beams 4. The second end of the excitation beam 6 connected to the excitation base part 5 is displaceable in the Y-direction, and the second end of the detection beam 4 connected to the mass part 3 is displaceable in the X-direction. Therefore, the mass part 3 may be displaced or vibrated in both of the X-direction and Y-direction.

Electroconductive plates 8, which respectively protrude at both sides along the X-direction, are disposed at the mass part 3. Capacitance detectors 9 are fixed at the case 15, so that the capacitance detectors 9 respectively face the conductive plates 8. An additional conductive plate is disposed at a surface of the capacitance detector 9 facing the electroconductive plate 8. The capacitance detector 9 detects a capacitance generated between the capacitance detector 9 and the electroconductive plate 8. The capacitance changes in proportion to a distance between the electroconductive plate 8 and an additional conductive plate of the capacitance detector 9. In other words, the capacitance detector 9 detects a displacement of the mass part 3 in the X-direction, according to the capacitance between the capacitance detector 9 and the electroconductive plate 8. The capacitance detector 9 at the right side of the drawing outputs the capacitance between the capacitance detector 9 and the conductive plate at the right side of the drawing, as an electrical signal 'Signal_a'. The capacitance detector 9 at the left side of the drawing outputs the capacitance between the capacitance detector 9 and the electroconductive plate 8 at the left side of the drawing, as an electrical signal 'Signal_b'. 'Signal_a' and 'Signal_b' are sent to the controller 10.

Since the capacitance detected by the capacitance detector 9 is proportional to the displacement of the mass part 3 in the X-direction, the capacitance detector 9 functions as a displacement detector, which detects the amount of displacement of the mass part 3 in the X-direction.

At the excitation base part 5, plural movable electroconductive plates 5a extend in a comb shape. The exciter 7 is fixed to the case 15 to face the movable electroconductive plate 5a of the excitation base part 5. The exciter 7 is fixed to the case 15 through an insulation layer 17. Although the case 15 is electrically connected to a ground of the apparatus, the exciter 7 is insulated from the case 15, and is applied by a predetermined voltage.

Plural fixed electroconductive plates 7a, which are disposed in a comb shape, extend from the exciter 7. Each fixed electroconductive plate 7a is disposed to extend between the adjacent movable electroconductive plates 5a. The controller 10 applies a voltage, which changes between 0 volt and a predetermined voltage at a predetermined frequency, to the fixed electroconductive plate 7a. When the voltage is applied to the fixed electroconductive plate 7a, and an electrostatic force is generated to attract the movable electroconductive plate 5a between the fixed electroconductive plates 7a. The electrostatic force changes periodically according to a change in the voltage. An alternating voltage, whose phase is shifted by 180 degrees, is applied as an alternating voltage superimposed on a direct-current voltage to the upper exciter 7 and the lower exciter 7 in FIG. 3. The electrostatic force, which is periodically acting in the Y-direction, is applied to two excitation base parts 5. As a result, the excitation base part 5, the detection beam 4 and the mass part 3 vibrate in the Y-direction with a predetermined frequency. The frequency of a voltage applied by the controller 10 is adjusted to the resonance frequency, in a situation that the excitation beam 6, the excitation base part 5, the detection beam 4 and the mass part 3 vibrate in the Y-direction. In other words, the exciter 7 causes the mass part 3 to vibrate in the Y-direction with the resonance frequency. The resonance frequency in the Y-direction may be referred to as the excitation resonance frequency. The mass part 3 supported by the detection beam 4 may vibrate also in the X-direction. The resonance frequency of the vibration system included in the detection beam 4 and the mass part 3 in the X-direction may be referred to as the detection resonance frequency.

'Signal_a', 'Signal_b', which are output by the capacitance detector 9, are sent to the controller 10. The controller 10 includes a differentiator 11 and a calculator 12. The differentiator 11 outputs a difference between 'Signal_a' and 'Signal_b' output by the capacitance detector 9. When the gyroscope 2 rotates around the Z-axis as the mass part 3 vibrates in the Y-direction, the Coriolis force acts on the mass part 3 in the X-direction according to the rotational angular velocity and the velocity in the Y-direction. The Coriolis force causes the mass part 3 to displace in the X-direction. The angular velocity around the Z-axis received by the gyroscope 2 and the displacement of the mass part 3 in the X-direction are defined by a predetermined function, which adopts the velocity of the mass part 3 in the Y-direction as a variable. The velocity of the mass part 3 in the Y-direction is evaluated based on a command value (for example, the command value of a voltage changing periodically) supplied to the exciter 7. The calculator 12 adopts the velocity in the Y-direction and the predetermined function to calculate the angular velocity 'Wz' around the Z-axis of the gyroscope based on the output difference between two capacitance detectors 9, and outputs the result.

The gyroscope 2 may detect the angular velocity 'Wz' around the Z-axis as shown in FIG. 3. The mass part 3 vibrates in the Y-direction at the excitation resonance frequency. When the gyroscope 2 rotates at the angular velocity 'Wz' around the Z-axis, the Coriolis force in the X-direction acts on the mass part 3 according to the angular velocity 'Wz' and the velocity of the mass part 3 in the Y-direction.

Since the velocity in the Y-direction changes at the excitation resonance frequency, the mass part 3 receiving the Coriolis force vibrates also in the X-direction at the excitation resonance frequency. In the gyroscope 2, the resonance frequency (the detection resonance frequency) of the vibration in the X-direction (such as the detection direction) is adjusted to be consistent with the resonance frequency (the excitation resonance frequency) of the vibration in the Y-direction (such as the excitation direction). The gyroscope 2 is a resonant-type in which the excitation resonance frequency coincides with the detection resonance frequency. The Y-direction may be referred to as the excitation direction, and the X-direction may be referred to as the detection direction.

The resonant-type vibration gyroscope may have higher accuracy of detecting the angular velocity, because the amplitude of the vibration in the detection direction (for example, the vibration in the X-direction in the present embodiment) enlarges. However, in a situation where the excitation resonance frequency and the detection resonance frequency are slightly different, the amplitude of the vibration in the detection direction greatly reduces, and the angular velocity measurement sensitivity greatly changes due to structural dimensional tolerances or temperature change. In the gyroscope 2 according to the embodiment, the Q-factor of the vibration in the detection direction (namely, the detection Q-factor) is lower than the Q-factor of the vibration in the excitation direction (namely, the excitation Q-factor), and hence a change in the angular measurement sensitivity with respect to the difference of both frequencies is smaller. The definition of Q-factor and the reason of having a smaller change in the angular measurement sensitivity with respect to the difference of both frequencies are described above.

The following describes one or more structures for adjusting the Q-factor of vibration in the gyroscope 2 according to the embodiment. In order to set the detection Q-factor being smaller than the excitation Q-factor, the detection Q-factor may be lowered or the excitation Q-factor may be enlarged. The following describes a relationship between various characteristics (parameters) of a beam and the Q-factor of vibration.

The Q-factor of vibration of the beam may be expressed as a function of the following dimensionless indices τ and κ.

$$\tau = \frac{Const \cdot \lambda}{cv \cdot wb^2 \cdot \omega_0} \qquad \text{[Mathematical Expression 1]}$$

$$\kappa = \frac{E \cdot \alpha^2 \cdot T_0}{cv}$$

In the Mathematical Expression 1, the meaning of each symbol is written in Table 1.

TABLE 1

| Symbol | Meaning | Numeral Value | Unit |
|---|---|---|---|
| f | Frequency | 50,000 | kHz |
| λ | Thermal Conductivity | 149 | W/m/K |
| cv | Specific Heat Capacity | 1.68E+06 | J/m³/K |
| wb | Beam Width | 5.00E−05 | M |
| ω₀ | Angular Frequency | 3.14E+05 | rad/s |

TABLE 1-continued

| Symbol | Meaning | Numeral Value | Unit |
| --- | --- | --- | --- |
| E | Young's Modulus | 1.50E+11 | Pa |
| α | Linear Expansion Coefficient | 2.60E−05 | 1/k |
| To | Initial Temperature | 300 | K |

The Q-factor of vibration may be expressed as a function of the dimensionless indices the dimensionless indices τ and κ. That is, Q-factor=f(τ, κ). The function f (τ, κ) is used in the technical field of vibration.

The following describes the relationship between various characteristics (parameters) of the beam included in the Mathematical Expression 1 and the Q-factor. When the beam vibrates, heat energy is generated locally. The generated heat diffuses throughout the beam. In other words, the locally generated heat energy moves. First, it is assumed that a resonance state is influenced by only mechanical vibration without considering the movement of heat energy in the beam. The resonance state refers to a state in which the period exactly matches the exchange of the a kinetic energy of the mass part added to the end of the beam and a potential (latent) energy due to a restoration force of the beam. The period 'f' is expressed as the following Mathematical Expression 2 including the mass 'm' and the rigidity 'k' of a beam.

$$f = \frac{1}{2\pi} \cdot \sqrt{\frac{k}{m}} \quad \text{[Mathematical Expression 2]}$$

However, there is a phenomenon called a thermoelastic effect, which is not generally considered. At the base of the beam, tensile stress is generated on one side (outside of the bending curve) and compressive stress is generated on the other side (inside of the bending curve), due to the bending of the beam. The temperature drops in response to the magnitude of the tensile stress. The temperature rises in response to the magnitude of the compressive stress. The maxima of these stresses occur at the outermost surface of the beam, but not at the center of the beam. Due to these temperature changes, the beam material generates compressive stress (elongation) as the temperature rises, and generates tensile stress (contraction) as the temperature drops. The compressive stress and tensile stress due to the temperature change are phenomena different from the resonance state due to mechanical vibration. When the base of the beam is elongated or contracted due to temperature, an external force, which affects the resonance state of the beam, is generated.

In a situation that the period of an external force causing the beam to vibrate through a thermoelastic effect is completely the same as the resonance state due to mechanical vibration, the Q-factor of vibration is maintained at a higher value without affecting the vibration. However, in a situation where the phase shift is 180 degrees, since the external force caused by the thermoelastic effect is a force opposing the mechanical vibration, the amplitude of the external force is smaller and the Q-factor is smaller. In other words, the Q-factor in the vibration system may be controlled by controlling the timing of occurrence of the thermoelastic effect with respect to the mechanical vibration. The Q-factor of the entire vibration in consideration of the thermoelastic effect is obtained from an expression having the dimensionless indices τ and κ, as indicated in the previously described Mathematical Expression 1.

The Q-factor in consideration of the thermoelastic effect is determined by the frequency 'f', the specific heat capacity 'cv', the beam width 'wb', the Young's modulus 'E', the linear expansion coefficient 'a' and the initial temperature 'To'. In general, there are some limitations to adjust the frequency 'f', the beam width 'wb', and the Young's modulus 'E', which determine the resonance frequency. The thermal conductivity 'λ', the specific heat capacity 'cv' and the linear expansion coefficient 'a' may be used as variables to adjust the Q-factor. The Q-factor of the detection beam may be lowered or the Q-factor of the excitation beam may be enlarged by adjusting these variables.

Figure 4:
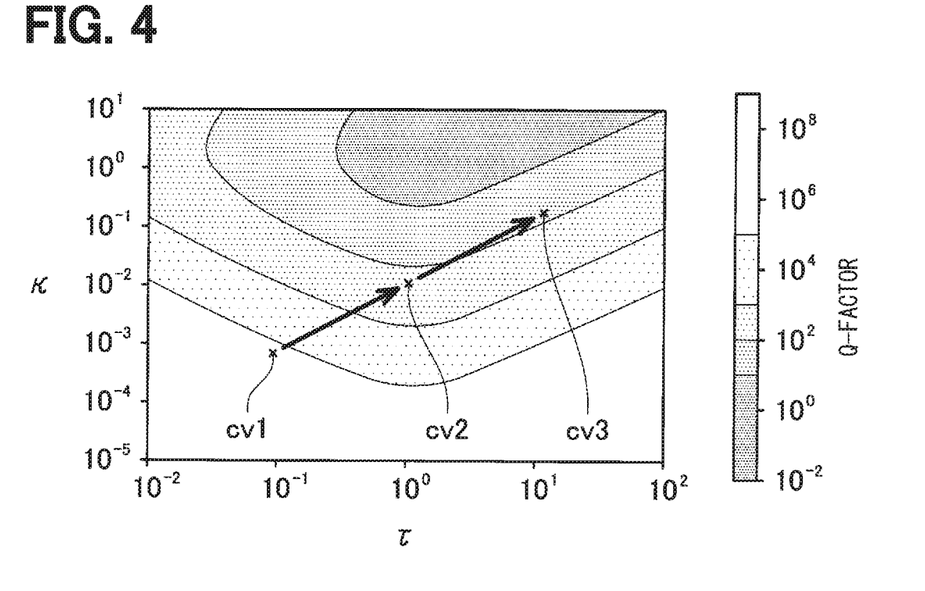
FIG. 4 shows a relationship between a change in specific heat 'cv' of a beam and the Q-factor.
Figure 5:
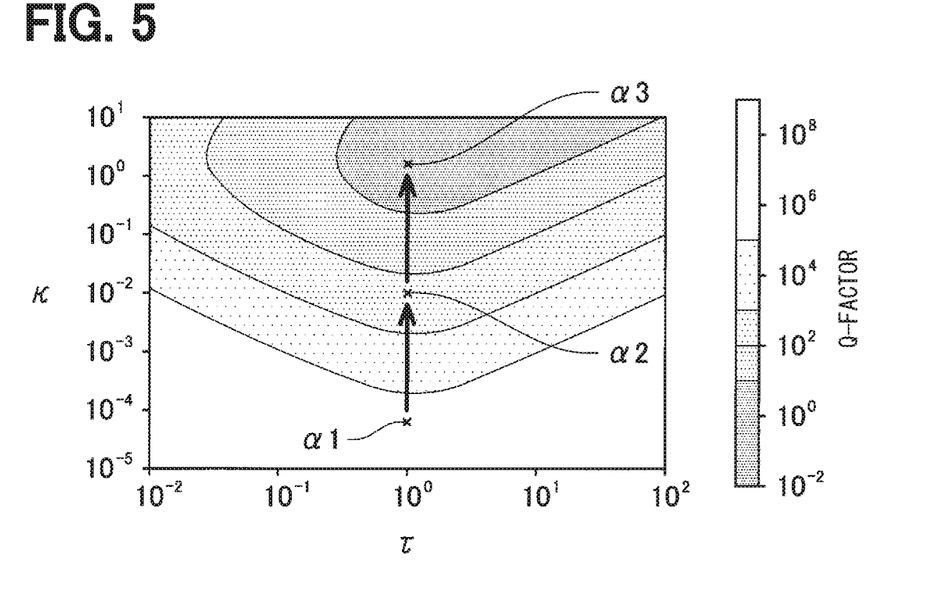
FIG. 5 shows a relationship between a change in linear expansion coefficient 'a' of a beam and the Q-factor.
Figure 6:
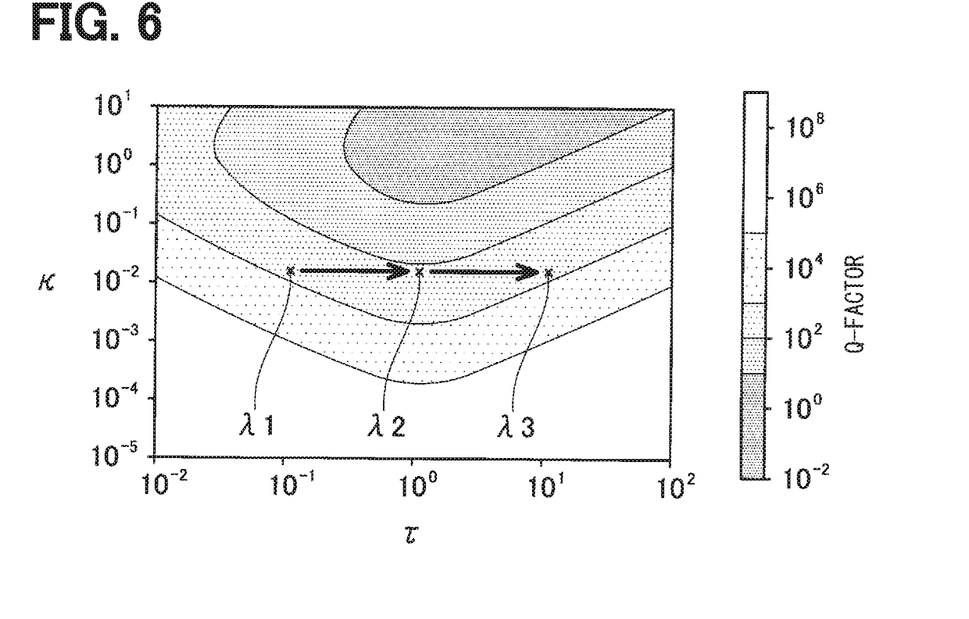
FIG. 6 shows a relationship between a change in thermal conductivity 'λ' of a beam and the Q-factor.

FIGS. 4 to 6 are contour plots of the Q-factor with the dimensionless index 'K' on a vertical axis and the dimensionless index 'T' on a horizontal axis. For the frequency 'f', the initial values such as the thermal conductivity 'λ' are the values described in Table 1. FIGS. 4 to 6 illustrate that the Q-factor is smaller as the dot-hatching is darker. FIG. 4 illustrates the transition of the Q-factor, in a situation where the specific heat capacity 'cv' of the beam is changed to 'cv1' (=1.68E+07 J/m$^3$/K), 'cv2'(=1.68E+06 J/m$^3$/K), and 'cv3' (=1.68E+05 J/m$^3$/K). It may be understood from FIG. 4 that the Q-factor tends to decrease as the specific heat capacity 'cv' decreases. In other words, there is a positive correlation between the specific heat capacity 'cv' of the beam and the Q-factor.

FIG. 5 illustrates the transition of the Q-factor, in a situation where the linear expansion coefficient 'a' of the beam is changed to 'a1' (=2.60E−06 1/k), 'a2' (=2.60E−05 1/k), and 'a3' (=2.60E−04 1/k). It may be understood from FIG. 5 that the Q-factor tends to decrease as the linear expansion coefficient 'a' is enlarged. In other words, there is a negative correlation between the linear expansion coefficient 'a' and the Q-factor.

FIG. 6 illustrates the transition of the Q-factor, in a situation where the thermal conductivity 'λ' of the beam is changed to 'λ1' (=14.9 W/m/K), 'λ2' (=149 W/m/K), and 'λ3' (=1490 W/m/K). It may be understood from FIG. 6 that the Q-factor is adjusted by changing the thermal conductivity 'λ'.

For example, in the vibration gyroscope 2 having the structure shown in FIG. 3, the detection Q-factor may be set to be smaller than the excitation Q-factor by lowering the specific heat capacity 'cv' of the detection beam 4. Alternatively, the detection Q-factor may be set to be smaller than the excitation Q-factor by lowering the specific heat capacity 'cv' of the excitation beam 6.

Figure 7:
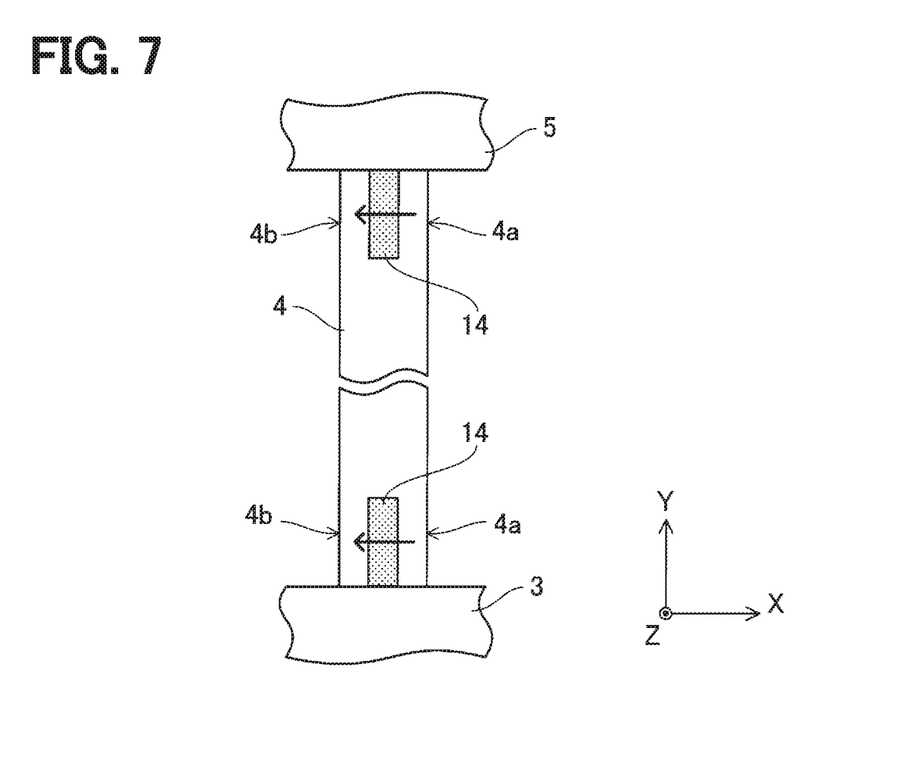
FIG. 7 is an enlarged plan view of a structure of a detection beam (such as a second beam).

The structure in which the vibration energy of the detection beam 4 is easily dissipated contributes to lowering the detection Q-factor. An example of a structure for lowering the specific heat capacity 'cv' of the detection beam 4 is illustrated in FIG. 7. FIG. 7 is an enlarged view of the detection beam 4 in FIG. 3.

As described above, the gyroscope 2 is made on the silicon substrate by MEMS technology. The detection beam 4 is also made of silicon. The detection beam 4 may be made of a single crystal of silicon, or may be made of polycrystal of silicon. Grooves are disposed at both ends of the detection beam 4. A member (such as a low-specific-heat member 14), which has a smaller specific heat capacity than silicon, is embedded in the groove. In FIG. 7, the low-specific-heat member 14 is illustrated in light gray color for better understanding. The low-specific-heat member 14 is embedded in the central portion of the detection beam 4 in the detection direction (such as the X-direction in the drawing).

The following describes the reasons why the Q-factor is lowered by embedding the low-specific-heat member 14. Since the detection beam 4 vibrates in the detection direction (such as the X-direction), the compressive stress is applied to one side of the detection direction (for example, the side indicated by the reference numeral '4a' in the drawing), and the tensile stress is applied to the other side of the detection direction (for example, the side indicated by the reference numeral '4b' in the drawing). The temperature rises at the side, where the compressive stress is applied, and the temperature drops at the side, where the tensile stress is applied. Heat energy flows from an edge 4a at a compression side, where the temperature is higher, to an edge 4b at a tension side, where the temperature is lower, as illustrated by a thick line in the drawing. The movement of heat between both sides of the detection beam 4 in the detection direction accelerates and the Q-factor is lowered by embedding a substance, which has a lower specific heat capacity, in the central portion in the detection direction.

Contrary to the structure in FIG. 7, a member having a larger specific heat capacity than silicon may be embedded in a portion of the excitation beam 6 made of silicon. Accordingly, the Q-factor of the excitation beam 6 is larger, and the Q-factor of the detection beam 4 is smaller than the Q-factor of the excitation beam 6. The specific heat capacity of silicon is 461 [J/Kg° C.]. Members having a larger specific heat capacity than silicon may be, for example, beryllium (specific heat capacity: 2180 [J/Kg° C.]) or aluminum (specific heat capacity: 900 [J/Kg° C.]).

Figure 8:
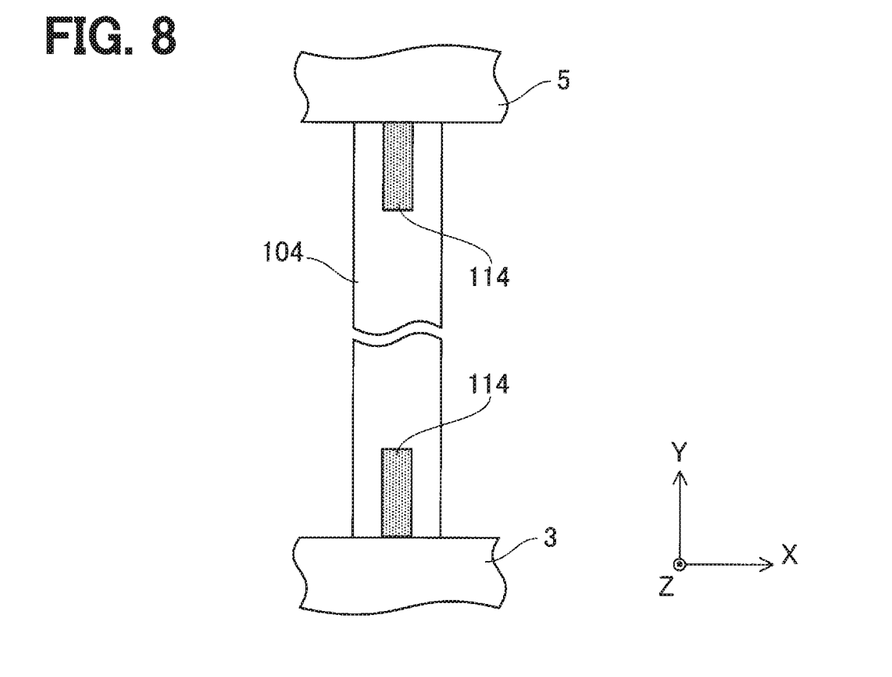
FIG. 8 is an enlarged plan view of the detection beam according to a first modification.

The following describes a first modification for lowering the Q-factor of the detection beam 4 with reference to FIG. 8. FIG. 8 is an enlarged plan view of the detection beam 104 according to the first modification. The detection beam 104 is also made of silicon. A substance (such as a high-thermal-conductivity member 114) with a higher thermal conductivity 'λ' than silicon is embedded in the end part of the detection beam 104. FIG. 8 illustrates the high-thermal-conductivity member 114 in dark gray color for better understanding. In a situation where the thermal conductivity 'λ' is enlarged at the end of the detection beam 104, the heat generated by vibration easily diffuses, and the Q-factor of vibration in the detection direction may be lowered. The thermal conductivity 'λ' of silicon is 168 [W/(m·K)]. Substances (such as a high-thermal-conductivity member 114) with a higher thermal conductivity 'λ' than silicon may be, for example, diamond (thermal conductivity 'λ': 1500 [W/(m·K)]), carbon nanotube (thermal conductivity 'λ': 5000 [W/(m·K)]), aluminum (thermal conductivity 'λ': 236 [W/(m·K)]), and beryllium (thermal conductivity 'λ': 216 [W/(m·K)]).

A substance with a higher thermal conductivity 'λ' may be embedded into the end part of the detection beam 104 by doping. The substance for doping may be, for example, boron ions or phosphorus ions. The doping amount may be, for example, 19 [atm/cm$^3$]. In a situation where boron ions or phosphorus ions are doped, the thermal conductivity 'λ' may be enhanced by 10 times or more than the thermal conductivity of undoped silicon.

Figure 9:
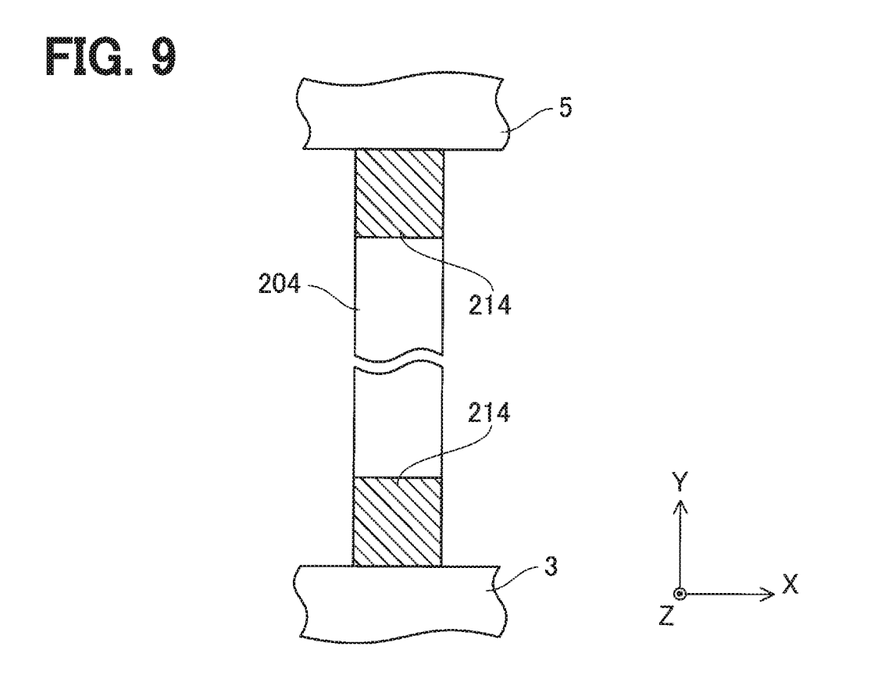
FIG. 9 is an enlarged plan view of a structure of the detection beam according to a second modification.

As illustrated in FIG. 9, the Q-factor in the detection direction may be lowered, by covering the surface of the end part of a detection beam 204 made of silicon with a substance (such as a high-thermal-conductivity film 214) having a higher thermal conductivity 'λ' than silicon. FIG. 9 is an enlarged plan view of the detection beam 204 according to a second modification. The high-thermal-conductivity film 214 is illustrated by a hatched portion for better understanding in FIG. 9.

Figure 10:
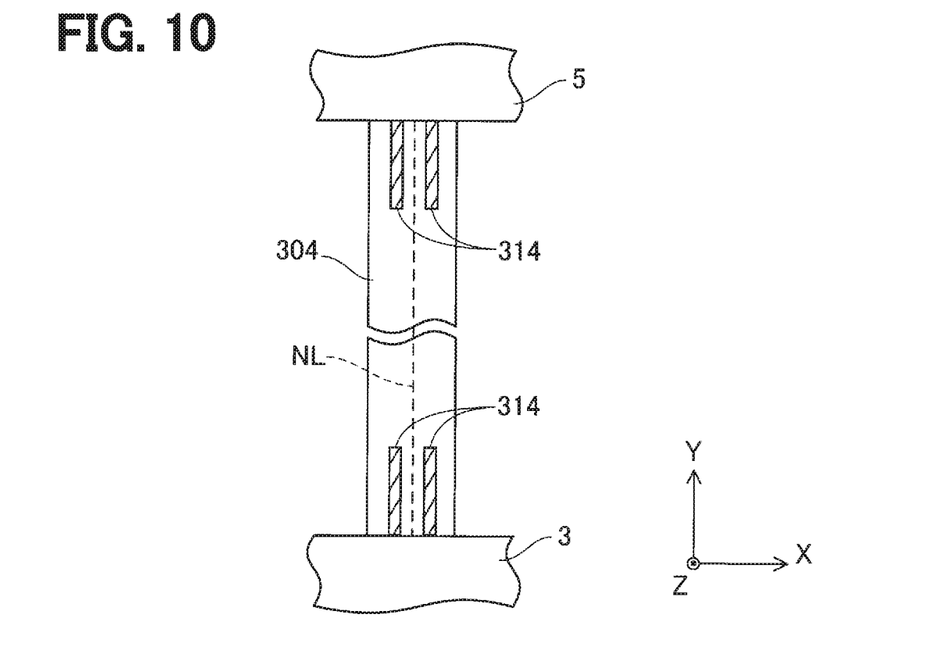
FIG. 10 is an enlarged plan view of a structure of the detection beam according to a third modification.

The following describes another example of lowering the Q-factor of the detection beam (such as the second beam) with reference to FIG. 10. FIG. 10 is an enlarged plan view of a detection beam 304 according to a third modification. The detection beam 304 is also made of silicon. A substance (such as a large-linear-expansion member 314) with a higher linear expansion coefficient 'a' than silicon is embedded in a position deviated from a neutral surface of the detection beam 304 in the vibration in the detection direction (such as the X-direction). In FIG. 10, the large-linear-expansion member 314 is illustrated by a hatched portion for better understanding. A broken line NL in FIG. 10 indicates a neutral surface. The neutral surface NL is a virtual plane where neither tensile stress nor compressive stress occurs in a situation where the detection beam 304 vibrates in the detection direction (such as the X-direction). The dimensionless index 'κ' for determining the Q-factor is proportional to the beam's Young's modulus 'E', the square of the linear expansion coefficient 'α' and the initial temperature To, and is inversely proportional to the specific heat capacity 'cv'. The Q-factor of vibration in the detection direction may be lowered by embedding a substance with a higher linear expansion coefficient 'α' (such as the large-linear-expansion member 314) in the detection beam 304. Since the Q-factor depends on the magnitude of the internal stress of the beam, the Q-factor may be effectively lowered by embedding the large-linear-expansion member 314 in a location where stress is generated (such as a location deviated from the neutral surface NL), but not in a location where stress is not generated (such as the neutral surface NL).

Figure 11:
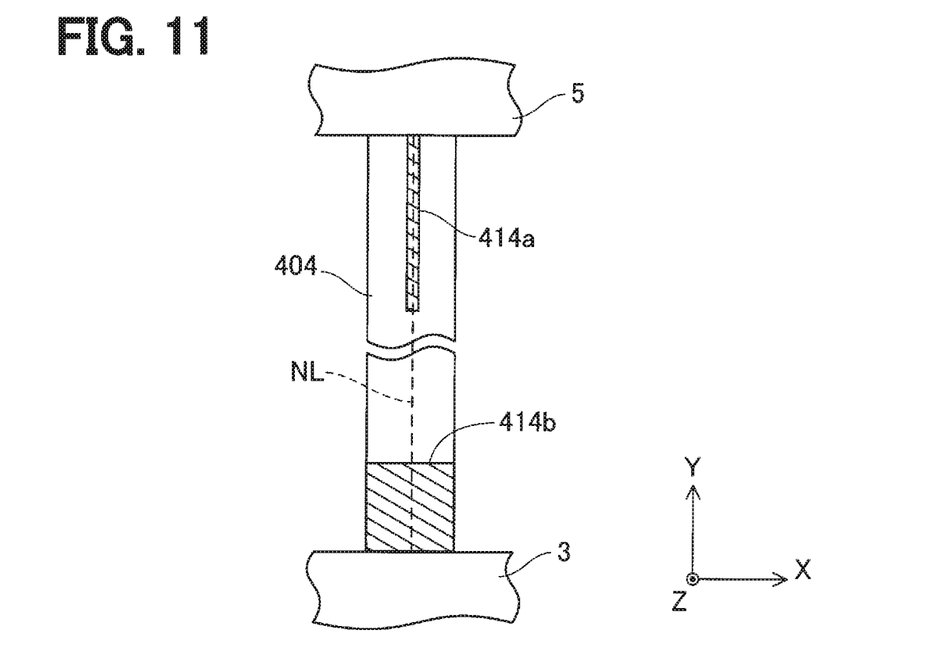
FIG. 11 is an enlarged plan view of a structure of the detection beam according to a fourth modification.

FIG. 11 is an enlarged plan view of a detection beam 404 according to a fourth embodiment. The detection beam 404 is also made of silicon. A substance (such as high-internal-friction member 414a, 414b), which has a higher internal friction than silicon during deformation, is embedded in the detection beam 404. The Q-factor of vibration in the detection direction may be lowered also by embedding the high-internal friction members 414a, 414b in the detection beam 404. Since energy is dissipated by internal friction, the Q-factor drops. A member having higher internal friction, such as the high-internal-friction member 414a, may be embedded to overlap the neutral surface NL. Even though the high-internal-friction member 414a is embedded to overlap the neutral surface NL, since the high-internal-friction member 414a has a reasonable thickness in the detection direction, sheer force acts on the interior of the high-internal-friction member 414a during vibration and the dissipated energy is generated.

Alternatively, the member having higher internal friction, such as the high-internal-friction member 414b, may be disposed to cover the detection beam 404 made of silicon. The material having a larger internal friction than silicon may be, for example, magnesium or polyimide resin. On the other hand, the Q-factor of the detection beam may be set to be smaller than the Q-factor of the excitation beam, by embedding a member having a smaller internal friction in the excitation beam.

Figure 12:
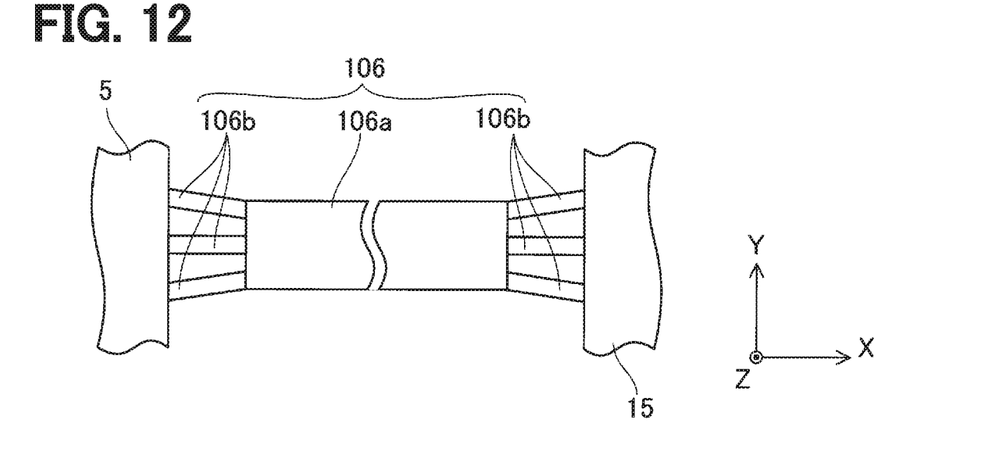
FIG. 12 is an enlarged plan view of structure of an excitation beam according to a first modification.

The following describes a modification of the excitation beam 6. The detection Q-factor may be set to be smaller by enlarging the Q-factor (such as excitation Q-factor) of vibration of the excitation beam 6. FIG. 12 illustrates an enlarged view of the excitation beam (such as an excitation beam 106) according to a first modification. The excitation beam 106 includes a main beam 106a and plural auxiliary beams 106b. The plural auxiliary beams 106b each have a beam width smaller than the beam width of the main beam 106a. Several auxiliary beams 106b connect one end of the main beam 106a and the excitation base part 5. The remainder of auxiliary beams 106b connect the other end of the main beam 106a and the case 15. Since the auxiliary beam 106 has a narrow beam width, the Q-factor of the excitation beam 106 is enlarged. Such results are obtained by finite element method (FEM) analysis.

On the other hand, in general, when the beam's width is narrowed, the beam's resonance frequency decreases. Thus, a target resonance frequency may not be attained. The excitation beam 106 according to the first modification may attain a target beam's rigidity and enlarge the excitation Q-factor by using the plural auxiliary beams 106b.

The auxiliary beam 106b located at the left or right side of a neutral line through the beam's center only works for tensile stress or compressive stress. Therefore, the heat energy is averaged by mixing the heat at both ends of the beam, and the excitation Q-factor may be avoided from decreasing due to energy loss.

Figure 13:
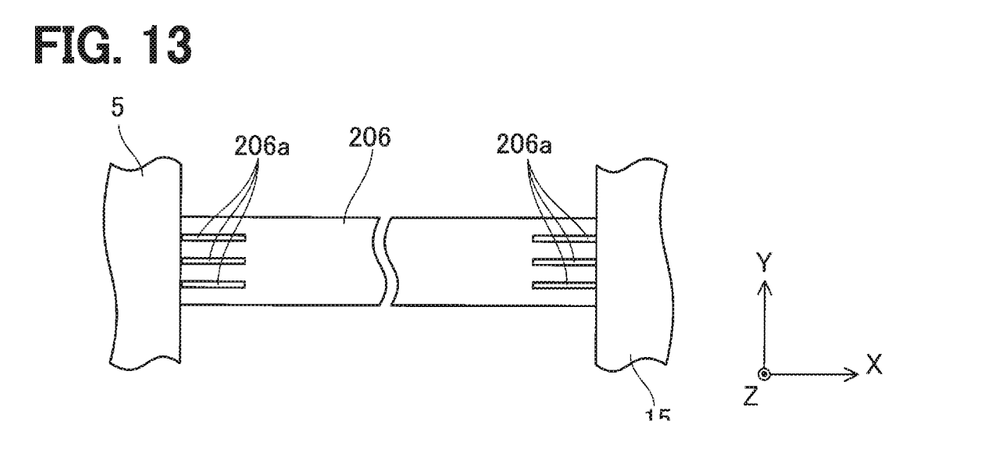
FIG. 13 is an enlarged plan view of a structure of the excitation beam according to a second modification.
Figure 14:
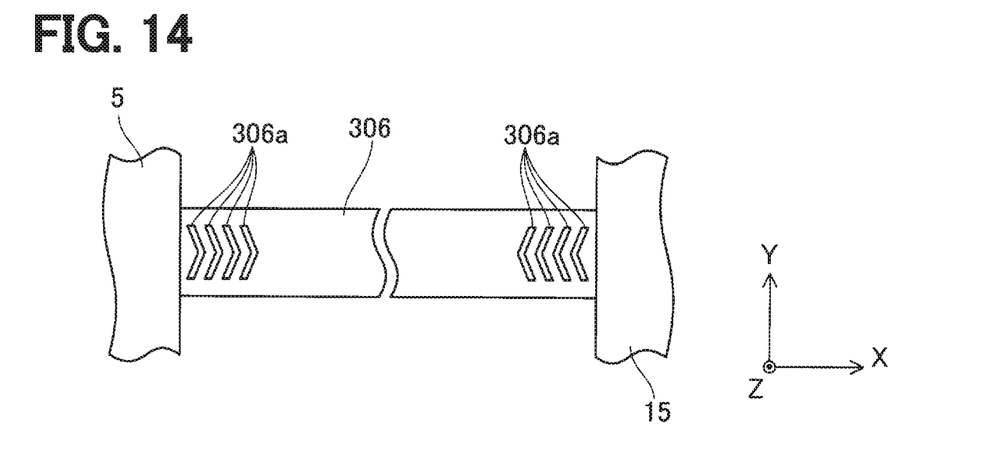
FIG. 14 is an enlarged plan view of a structure of the excitation beam according to a third modification.

The following describes an enlarged view of the excitation beam (such as an excitation beam 206) according to a second modification. The excitation beam 206 has slits 206a at both ends of the excitation beam 206. FIG. 14 illustrates an enlarged plan view of the excitation beam according to a third modification (such as an excitation beam 306). The excitation beam 306 includes V-shaped slits 306a at both ends of the excitation beam 306. The linear slit 206a has the similar effect, in a situation where the beam's thermal conductivity is lowered. The V-shaped slit 306a has the similar effect, in a situation of widening the beam's width and increasing the distance between a location with low temperature and a location with high temperature. For any slit shape, the easiness of heat transfer may be adjusted. The Q-factor of vibration may be adjusted by adjusting the easiness of heat transfer.

The following describes points of attention in the embodiment. The mass part 3, the excitation base part 5, the excitation beam 6, and the detection beam 4 are stored in the case 15. The interior of the case 15 is maintained in a vacuum state. As the interior of the case 15 is maintained at the vacuum state, the vibrations of the mass part 3, the excitation base part 5, the excitation beam 6 and the detection beam 4 are not affected by air viscosity and temperature. The gyroscope 2 has higher measurement accuracy, as the gyroscope is not affected by air viscosity and temperature. In the gyroscope 2, the influence of a change in the measurement sensitivity due to the difference between the excitation resonance frequency and the detection resonance frequency is greater. The gyroscope 2 according to the embodiment exhibits a remarkable effect of lowering a change in measurement sensitivity through setting the detection Q-factor to be lower than the excitation Q-factor. The correspondingly effect may also be attained, even though the interior of the case 15 is not maintained in the vacuum state.

In the embodiment, the detection beam 4 is made of silicon. The excitation beam 6 and the mass part 3 may also be made of silicon. However, the material for the beam or mass part may not be limited to silicon.

The X-direction in the drawing corresponds to a first direction (such as the detection direction), and the Y-direction in the drawing corresponds to a second direction (such as the excitation direction). The capacitance detector 9 according to the embodiment corresponds to an example of the detector for detecting the amount of displacement of the mass part 3 in the second direction.

The case 15 corresponds to an example of the fixing part. The exciter 7 according to the embodiment generates an electrostatic force to vibrate the mass part 3 (excitation base part 5). The exciter 7 may be of a type that excites the mass part with a piezoelectric element or another type.

Although the present disclosure has been described in accordance with the examples, it is understood that the present disclosure is not limited to such examples or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A vibration gyroscope comprising:
a mass part supported to be displaceable in a first direction and a second direction, the first direction and the second direction being orthogonal to each other;
an exciter configured to vibrate the mass part in the first direction;
a detector configured to detect a displacement amount of the mass part in the second direction;
a first beam extending along the second direction and including a first end and a second end, the first end of the first beam fixed to a fixing part;
an excitation base part connected to the second end of the first beam; and
a second beam extending along the first direction and including a first end and a second end, the first end of the second beam connected to the excitation base part and the second end of the second beam connected to the mass part,
wherein the exciter is configured to vibrate the excitation base part in the first direction,
wherein a resonance frequency of the mass part in the first direction coincides with a resonance frequency of the mass part in the second direction,
wherein a Q-factor of vibration of the mass part in the second direction is smaller than a Q-factor of vibration of the mass part in the first direction,
wherein the second beam is made of silicon, and
wherein the second beam includes a substance, which has a smaller specific heat capacity than the silicon, embedded in a central portion of an end part of the second beam in the second direction.

2. A vibration gyroscope comprising:
a mass part supported to be displaceable in a first direction and a second direction, the first direction and the second direction being orthogonal to each other;
an exciter configured to vibrate the mass part in the first direction;
a detector configured to detect a displacement amount of the mass part in the second direction;
a first beam extending along the second direction and including a first end and a second end, the first end of the first beam fixed to a fixing part;
an excitation base part connected to the second end of the first beam; and
a second beam extending along the first direction and including a first end and a second end, the first end of the second beam connected to the excitation base part and the second end of the second beam connected to the mass part,
wherein the exciter is configured to vibrate the excitation base part in the first direction, wherein a resonance frequency of the mass part in the first direction coincides with a resonance frequency of the mass part in the second direction, wherein a Q-factor of vibration of the mass part in the second direction is smaller than a Q-factor of vibration of the mass part in the first direction, wherein the second beam is made of silicon, and wherein the second beam includes a substance, which has a larger linear expansion coefficient than the silicon, embedded in a position of the second beam deviated from a neutral surface of a vibration in the second direction.

3. A vibration gyroscope comprising:

a mass part supported to be displaceable in a first direction and a second direction, the first direction and the second direction being orthogonal to each other;

an exciter configured to vibrate the mass part in the first direction;

a detector configured to detect a displacement amount of the mass part in the second direction;

a first beam extending along the second direction and including a first end and a second end, the first end of the first beam fixed to a fixing part;

an excitation base part connected to the second end of the first beam; and a second beam extending along the first direction and including a first end and a second end, the first end of the second beam connected to the excitation base part and the second end of the second beam connected to the mass part, wherein the exciter is configured to vibrate the excitation base part in the first direction, wherein a resonance frequency of the mass part in the first direction coincides with a resonance frequency of the mass part in the second direction, wherein a Q-factor of vibration of the mass part in the second direction is smaller than a Q-factor of vibration of the mass part in the first direction, wherein the second beam is made of silicon, and wherein the second beam includes a substance, which has a higher internal friction during deformation than the silicon, embedded in an interior of the second beam.

4. The vibration gyroscope according to claim 3, wherein the substance is embedded to overlap the neutral surface of the vibration in the second direction.

5. The vibration gyroscope according to claim 1, wherein the second beam is made of silicon, and wherein the second beam includes an end part covered by a substance, which has a higher internal friction during deformation than the silicon.

6. The vibration gyroscope according to claim 1, wherein the first beam has a main beam and a plurality of auxiliary beams, and wherein each of the auxiliary beams is slimmer than the main beam, and connects the main beam and the fixing part.

7. The vibration gyroscope according to claim 1, wherein the first beam includes a main beam and a plurality of auxiliary beams, and wherein each of the auxiliary beams is slimmer than the main beam, and connects the main beam and the excitation base part.

8. The vibration gyroscope according to claim 1, wherein the mass part is stored in a vacuum case.

9. The vibration gyroscope according to claim 1, further comprising:

the fixing part as a vacuum case, wherein the vacuum case stores the mass part.

10. The vibration gyroscope according to claim 1, wherein the Q-factor in each of the first direction and the second direction is obtained by dividing the resonance frequency in each of the first direction and the second direction of the mass part by a half-value width, wherein the half-value width is a difference between a lower frequency in each of the first direction and the second direction of the mass part and a higher frequency in each of the first direction and the second direction of the mass part, wherein the lower frequency in each of the first direction and the second direction is lower than the resonance frequency in each of the first direction and the second direction, wherein the higher frequency in each of the first direction and the second direction is higher than the resonance frequency in each of the first direction and the second direction, wherein an amplitude of vibration of the mass part at the lower frequency in each of the first direction and the second direction is 0.707 times of an amplitude of a vibration of the mass part at the resonance frequency in each of the first direction and the second direction, and wherein an amplitude of vibration of the mass part at the higher frequency in each of the first direction and the second direction is 0.707 times of the amplitude of the vibration of the mass part at the resonance frequency in each of the first direction and the second direction.

* * * * *